(12) United States Patent
Eng

(10) Patent No.: US 7,138,860 B2
(45) Date of Patent: Nov. 21, 2006

(54) SYSTEM AND METHOD FOR ENVELOPE MODULATION

(75) Inventor: John E Eng, Buena Park, CA (US)

(73) Assignee: The Boeing Company, Chicago, IL (US)

( * ) Notice: Subject to any disclaimer, the term of this patent is extended or adjusted under 35 U.S.C. 154(b) by 124 days.

(21) Appl. No.: 10/904,498

(22) Filed: Nov. 12, 2004

(65) Prior Publication Data

US 2006/0103460 A1 May 18, 2006

(51) Int. Cl.
*H03F 3/58* (2006.01)
(52) U.S. Cl. .......................................... 330/43; 315/3.5
(58) Field of Classification Search .................. 330/43; 331/82; 332/149, 163–166
See application file for complete search history.

(56) References Cited

U.S. PATENT DOCUMENTS

| | | | | |
|---|---|---|---|---|
| 5,280,536 A | * | 1/1994 | Dumond et al. ............... | 372/82 |
| 5,838,195 A | | 11/1998 | Szmurlo et al. | |
| 5,940,025 A | * | 8/1999 | Koehnke et al. ............ | 342/159 |
| 6,229,262 B1 | * | 5/2001 | Hulsey et al. .................. | 315/9 |
| 6,285,254 B1 | | 9/2001 | Chen et al. | |
| 2002/0093379 A1 | | 7/2002 | Goren et al. | |
| 2003/0102911 A1 | | 6/2003 | Raghavan et al. | |

FOREIGN PATENT DOCUMENTS

EP 1478088 A2 11/2004

OTHER PUBLICATIONS

Martijn Kuipers, et al.; Pre-Distorted Amplifiers for OFDM In Wireless Indoor Multimedia Communications; Vehicular Technology Conference Proceedings; May 15, 2000; vol. 1 of 3; Conf. 51, pp. 395-399; Aalborg, Denmark.

Patent Cooperation Treaty International Search Report.
Patent Cooperation Treaty Written Opinion of International Searching Authority.
Yuanxum Wang; An Improved Kahn Transmitter Architecture Based on Delta-Sigma Modulation; MIcrowave Symposium Digest; Jun. 8-13, 2003; pp. 1327-1330; vol. 2.
Manoja D. Weiss, et al.; Linearity of X-band Class-F Power Amplifiers In High-Efficiency Transmitters; Microwave Theory and Techniques, IEEE Transactions; Jun. 6, 2001; pp. 1174-1179; vol. 49.
William H. Cantrell, et al.; Amplitude Modulator Utilizing a High-Q Class-E DC-DC Converter; Microwave Symposium Digest, 2003 IEEE MTT-S International; Jun. 8-13, 2003; pp. 1721-1724; vol. 3.
Frederick H. Raab, et al.; L-bandTransmitter Using Kahn EER Technique; IEE Transactions On Microwave Theory and Techniques; Dec. 12, 1998; vol. 46.
Dietmar Rudolph; Kahn EER Technique With Single-Carrier Digital Modulations; IEEE Transactions On MIcrowave Theory and Techniques; Feb. 2, 2003; pp. 548-552; vol. 51.

(Continued)

Primary Examiner—Robert Pascal
Assistant Examiner—Alan Wong
(74) Attorney, Agent, or Firm—Ostrager Chong Flaherty & Broitman P.C.

(57) ABSTRACT

A power control system for a satellite receiving radio-frequency signals includes a digital processor and a traveling wave tube amplifier system and corresponding traveling wave tube. An anode voltage of the traveling wave tube amplifier system is used to modulate or saturate the current of the electron beam of the traveling wave tube so that the output power of the traveling wave tube amplifier system, from the saturated electron beam, is proportional to a waveform envelope of the radio-frequency signals. The digital processor controls anode and RF input signal amplitudes to the traveling wave tube and predicts necessary corrections.

39 Claims, 3 Drawing Sheets

OTHER PUBLICATIONS

Dietmar Rudolph et al.; Out-of-band Emissions of Digital Transmissions Using Kahn EER TEchnique; IEEE Transactions on Microwave Theory and Techniques; Aug. 8, 2002; pp. 1979-1983; vol. 50.

J. Staudinger, et al.; High Efficiency CDMA RF Power Amplifier Using Dynamic Envelope Tracking Technique; Microwave Symposium Digest, 2000 IEEE MTT-S International; Jun. 11-16, 2000; pp. 873-876; vol. 2.

Gary Hanington, et al.; Microwave Power Amplifier Efficiency Imporvement With a 10 MHz HBT DC-DC Converter; Microwave Symposium Digest, 1998 IEEE MTT-S International; Jun. 7-12, 1998; pp. 589-592; vol. 2.

P.M. Asbeck, et al.; Device and Circuit Approaches For Improved Linearity and Efficiency In Microwave Transmitters; Microwave Symposium Digest, 1998 IEEE MTT-S International; Jun. 7-12, 1998; pp. 327-330; vol. 1.

Je-Kuan Jau, et al.; Linear Interpolation Scheme For Compensation of Path Delay Difference In An Envelope and Restoration Transmitter; Microwave Conference, 2001; Dec. 3-6, 2001; pp. 1072-1075; vol. 3.

Takana Kaho, et al.; A Distortion Control Technique for Achieving High Power Efficiency In An HPA Array; IEEE Transactions On Microwave Theory and Techniques; Nov. 11, 2002; pp. 2505-2512; vol. 50.

* cited by examiner

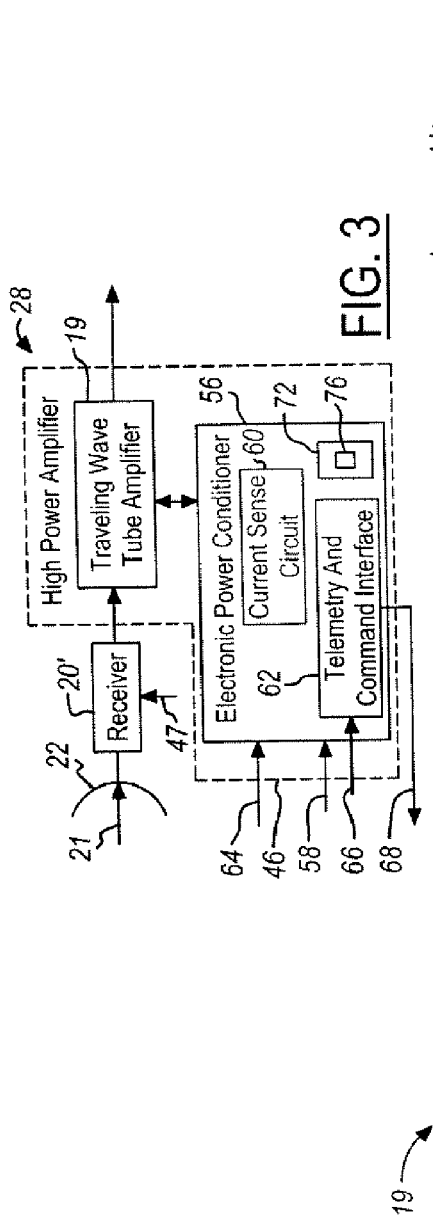
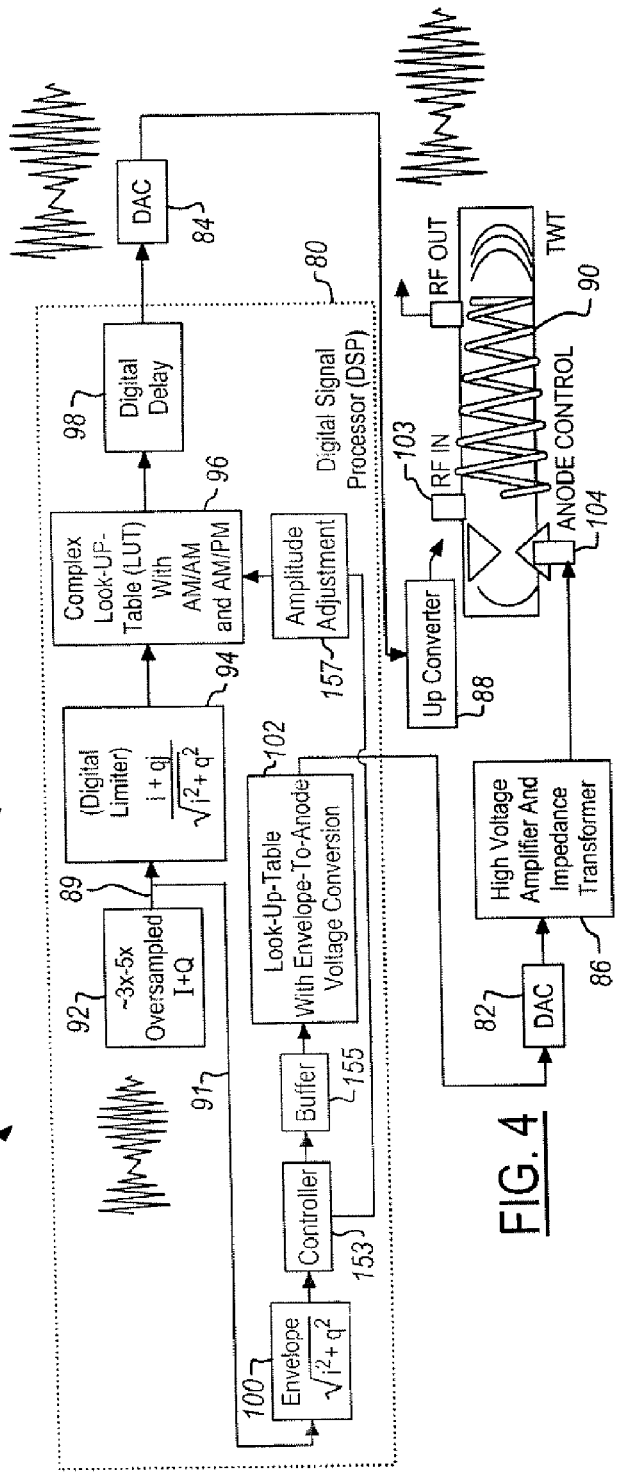
FIG. 3
FIG. 4

SYSTEM AND METHOD FOR ENVELOPE MODULATION

TECHNICAL FIELD

The present invention relates generally to communication satellites, and more particularly, to a system and method of increasing power efficiency for such satellites.

BACKGROUND ART

Communication satellite payloads typically use high power amplifiers to increase power of received signals. The high power amplifiers are grouped together in redundancy rings, such that each high power amplifier within the ring has the same operating frequency range, bandwidth, and output power. For example, a commercial satellite may include 40 Ku-Band 120 W traveling wave tube amplifiers, 24 C-Band 40 W traveling wave tube amplifiers, and 38 90 W Ka-Band traveling wave tube amplifiers. Each high power amplifier is required to meet down link power or effective isotropic radiated power (EIRP) requirements equivalent to adjacent high power amplifiers contained within a redundancy ring. However, different paths through the redundancy ring have varying amounts of loss and not all of the high power amplifiers have identical EIRP requirements. Therefore, extra power is provided to high power amplifiers that have lower EIRP requirements. This is generally not power efficient.

Additionally, current high power amplifiers are limited in that they are designed and manufactured for one specific performance application. A performance application may be associated with providing service to a specific service area or serving or providing backup to a particular business service plan. Differing performance applications require different output RF power levels.

In conventional satellite payloads a high power amplifier typically includes a power supply that monitors cathode current of a high power amplifier and adjusts anode voltage to maintain a constant cathode current via an analog feedback loop. Over time, as a cathode of the high power amplifier degrades, the power supply compensates for this change by adjusting anode voltage to maintain a constant cathode current for a single designed performance application.

Current power systems for satellites determine minimum EIRP for high power amplifiers and adjust saturated power output of the high power amplifiers to the minimum EIRP, thereby reducing power consumption of the systems. Reducing the amount of power consumed by various components is desired because it not only conserves energy but also allows additional transponders to be placed upon a satellite to generate additional revenue.

Unfortunately, although the above stated systems provide high power amplifiers with variable output power that may be externally adjusted when in orbit; they do not provide a technique for maintaining constant overall power efficiency when operating with non constant amplitude (envelope) signals such as those present when multiple carriers are being amplified by the same amplifier.

It would therefore be desirable to provide a high power amplifier system that has reduced operating power consumption and that is capable of maintaining an approximately constant power efficiency regardless of the variability in the amplitude or envelope of the signals being amplified.

SUMMARY OF THE INVENTION

The present invention provides a power control system for satellites receiving radio-frequency signals and including traveling wave tube amplifier systems having corresponding traveling wave tubes. An anode voltage of the traveling wave tube amplifier system is used to modulate or saturate the current of the electron beam of the traveling wave tube so that the output power of the traveling wave tube amplifier system, from the saturated electron beam, is proportional to a waveform envelope (i.e. envelope-to-anode voltage) of the radio-frequency signals.

In order to achieve very high speed modulation (>10 MHz), a very high slew rate is needed in the hardware modulation circuit. But, a high slew rate also comes at a cost, weight and power penalty. The present invention is a method for utilizing lower slew rate circuits while still allowing the broadband high efficiency traveling wave tube amplifier by envelope modulation of the electron beam to achieve significant power savings. The present invention generates a way to greatly increase the power efficiency (on the order of a factor of 2) of high powered traveling wave tube amplifiers transmitting signals with, for example, Amplitude Modulation (AM). The greater power efficiency allows for an increased number of transponders to be mounted on a satellite.

Another advantage of the present invention is that it provides a high power amplifier that is able to be externally controlled to maintain overall gain and efficiency, allowing the high power amplifier to be flexed over an RF output power dynamic range. In so doing, the present invention provides a high power amplifier that is capable of being used in multiple performance applications. By maintaining overall gain and efficiency, the present invention saves on power consumption.

Furthermore, the present invention reduces the amount of power consumed by a high power amplifier circuit by controlling the saturated output power level of a high power amplifier therein. In reducing the amount of power consumed in the high power amplifiers, the overall size of the spacecraft power system may be reduced or additional revenue generating transponders may be deployed on a satellite. Also, in controlling the saturation output power level, the present invention provides more DC power reduction than merely backing off drive power to the high power amplifiers.

The present invention itself, together with attendant advantages, will be best understood by reference to the following detailed description, taken in conjunction with the accompanying drawings.

BRIEF DESCRIPTION OF THE DRAWINGS

FIG. 3 is a detailed block diagrammatic view of a high power amplifier circuit in accordance with FIG. 2;

FIG. 4 is a block diagrammatic view of the traveling wave tube amplifier system in accordance with FIG. 3.

BEST MODES FOR CARRYING OUT THE INVENTION

Figure 1:
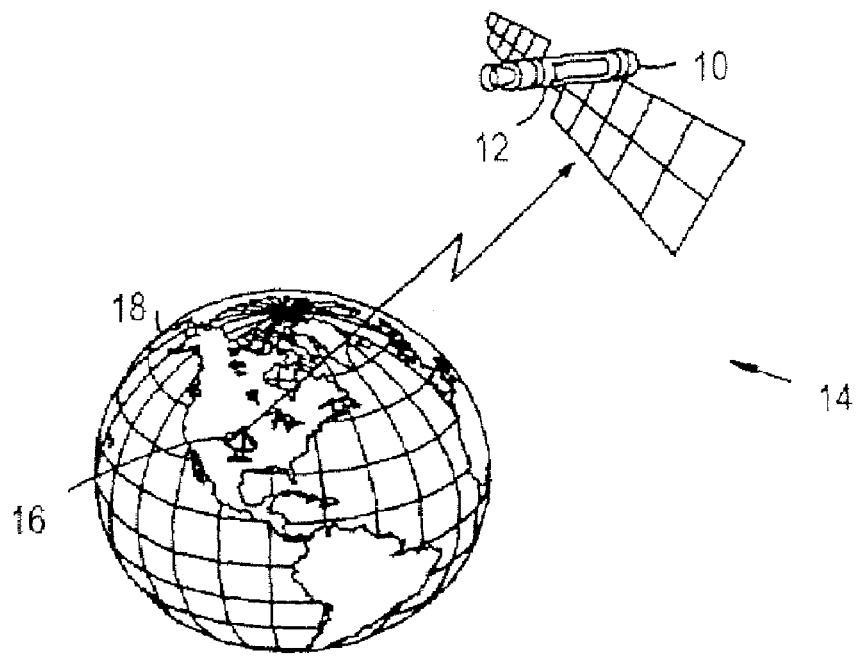
FIG. 1 is an elevational view of a satellite utilizing a power control system in accordance with one embodiment of the present invention.

In the following figures the same reference numerals will be used to identify the same components. While the present invention is described with respect to a system and method of controlling saturated output power of a power control system for a satellite, the present invention may be adapted for various high power amplifier applications known in the art. It should be understood that the present invention is applicable to various types of high power amplifiers as well as various numbers of high power amplifiers. Also, the present invention may be employed in groups or rings of high power amplifiers.

In the following description, various operating parameters and components are described for one constructed embodiment. These specific parameters and components are included as examples and are not meant to be limiting.

The present invention is a method for performing modulation required to dynamically change the maximum output power of a traveling wave tube such that a corresponding traveling wave tube amplifier system 19 can operate at maximum efficiency most of the time. This can increase the power efficiency of the traveling wave tube amplifier system 19 in proportion to approximately the average amount of time that a received radio-frequency (RF) signal is not at its peak amplitude.

The term used to define the maximum rate of change of an amplifier output voltage with respect to its input voltage is slew rate. In essence, slew rate is a measure of an amplifier ability to follow its input signal. It is measured by applying a large amplitude step function (a signal starting at 0 volts and "instantaneously" jumping to some large level without overshoot or ringing, creating a step-like look on an oscilloscope) to the amplifier under test and measuring the slope of the output waveform. For a "perfect" step input (i.e., one with a rise time at least 100 times faster than the amplifier under test), the output will not be vertical; it will exhibit a pronounced slope. The slope is caused by the amplifier having a finite amount of current available to charge and discharge its internal compensation capacitor.

In order to achieve very high speed modulation, a very high slew rate is needed in the hardware modulation circuit. But, a high slew rate also comes at a cost, weight, and power penalty. The present invention is a method for utilizing lower slew rate circuits while still allowing the broadband high efficiency traveling wave tube amplifier by envelope modulation of the electron beam to achieve significant power savings. The present invention generates an algorithm for greatly increasing the power efficiency of high powered traveling wave tube amplifiers transmitting signals with, for example, Amplitude Modulation (AM).

In other words, the present invention is a method for digitally controlling anode and RF input signal amplitudes and predicting necessary corrections. Important to note is that the present invention will work with any modulator that can tolerate some time delay and is not limited to the modulator or digital processor embodied herein.

Referring now to FIG. 1, an elevational view of a satellite 10 utilizing a power control system 12 in accordance with an embodiment of the present invention is shown. The satellite 10 includes a satellite communication system 14 having the power control system 12 therein. The communication system 14 communicates with a ground station 16 on earth 18. Signals within the satellite 10 are processed through a modulation circuit 19 or broadband high efficiency traveling wave tube amplifier operating through envelope modulation of the electron beam, which will be discussed in detail regarding FIG. 4. The aforementioned modulation is implemented through the algorithm discussed regarding FIG. 5, which allows for the use of lower slew rate control circuits than would otherwise be feasible.

Figure 2:
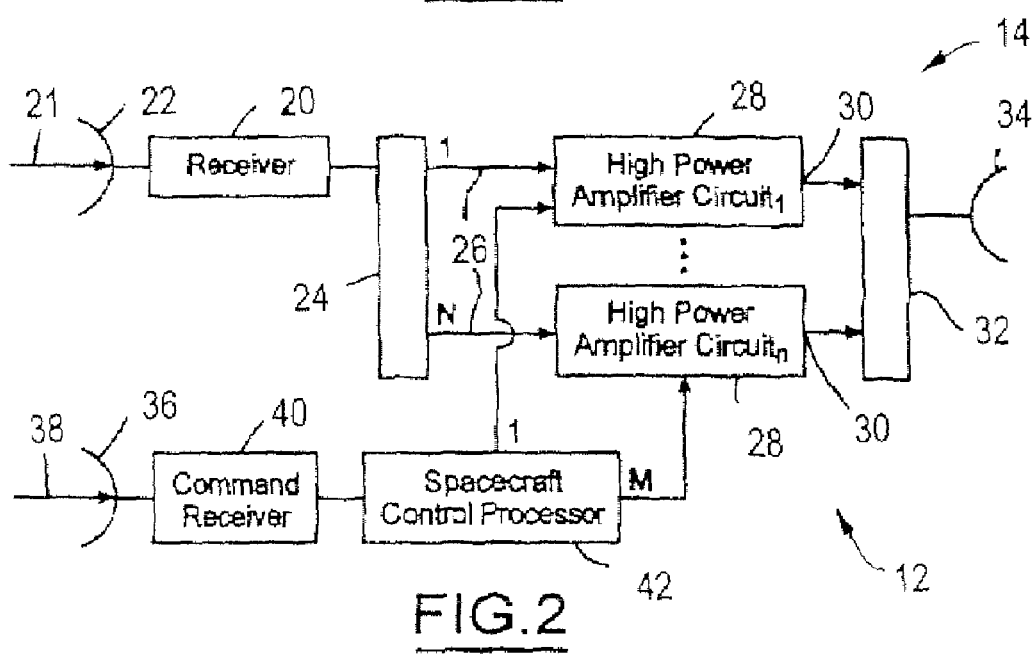
FIG. 2 is a simplified block diagrammatic view of a satellite communication system having the power control system in accordance with another embodiment of the present invention.

Referring now to FIG. 2, a simplified block diagrammatic view of the communication system 14 having the power control system 12 in accordance with an embodiment of the present invention is shown. The communication system 14 includes a receiver 20 that receives communication signals 21, via a receive antenna 22. Receiver 20 is coupled to switches and filters 24 that process the received communication signals 21 in a conventional manner. The switches and filters 24 divide the received signals 21 into various signal paths 26. Each of the signal paths 26 has a high power amplifier circuit 28 that has a variable power output 30. The amplifier circuits 28 are part of the power control system 12 and amplify the received signals 21. An output multiplexer 32 includes switches (not shown) and is coupled to the amplifier circuits 28. The multiplexer 32 receives the amplified received signals, which in turn are transmitted via an antenna 34.

The communication system 14 also includes a command antenna 36 receiving command signals 38 from the ground station 16. The command antenna 36 is coupled to a command receiver 40, and ultimately to a spacecraft control processor or controller 42. The controller 42 is also part of the power control system 12. The spacecraft control processor 42 may be coupled to various components including the amplifier circuits 28.

The controller 42 is preferably microprocessor based such as a computer having a central processing unit, memory (RAM and/or ROM), and associated input and output buses. The controller 42 may be a portion of a central main control unit, or may be a stand-alone controller as shown.

Referring now to FIG. 3, a detailed block diagrammatic view of a high power amplifier circuit 28 in accordance with an embodiment of the present invention is shown. Similar to the amplifier circuit 28, the amplifier circuit 28 receives communication signals 21 from a receiver 20, via an antenna 22. The amplifier circuit 28 amplifies and processes the communication signals 21 through a high power amplifier 46. The receiver 20 may include a command input 47. Each amplifier circuit 28 may have any number of channel amplifiers, high power amplifiers, and power conditioners.

The power amplifier 46 has an anode voltage operating range and amplifies the received signals 21. In one embodiment of the present invention, the power amplifier 46 includes an output power range approximately equal to 3 dB. The power amplifier 46 may be one of various types of high power amplifiers and include amplifiers, such as a traveling wave tube amplifier system 19, as shown, or a solid-state power amplifier (not shown). Each of the high power amplifiers 46 has a minimum isotropic radiated power output. The minimum effective isotropic radiated power varies within rings or groupings of the high power amplifiers 46. The saturated power output of the high power amplifiers 46 within groups of high power amplifiers may be reduced on an individual basis to reduce the amount of power consumption for the satellite 10.

The power amplifier 46 includes an electronic power conditioner 56 that is coupled within the power amplifier 46 and adjusts anode voltage of the power amplifier 46 in response to a command signal or a saturated power output adjustment signal 58. The power conditioner 56, although shown as being an integral part of the power amplifier 46 may be separate from the power amplifier 46.

The power conditioner 56 includes a current sense circuit 60 that adjusts anode voltage of the high power amplifier 46 to maintain a constant cathode current at a predetermined level. The power conditioner 56 may also maintain a constant cathode current through the high power amplifier 46 via a servo loop (not shown), as known in the art. The power conditioner 56 has a telemetry and command interface 62 that may be part of the controller 42. Telemetry and command interface 62 may also act as a controller in and of itself and be part of the controller 42, or part of the power conditioner 56. Power conditioner 56 includes a DC power input 64 that is used to supply power to the power amplifier 46. The power conditioner 56 has a command input 66 and a telemetry output 68.

As mentioned, the power conditioner 56 includes a programmable circuit 76. Although, the programmable circuit 76 is shown as being an integral part of the power conditioner 56. Also, any number of programmable circuits may be utilized within the amplifier circuit 28, even though only one is shown in FIG. 3. The programmable circuit 76 may be in the form of a programmable read only memory, a field programmable gate array, an application specific integrated circuit, a programmable logic device, or some other programmable circuit known in the art.

In one embodiment of the present invention, the programmable circuit 76 includes a look-up table 72, containing various parameters, such as gain, offset, set-point, anode voltage, cathode current, and phase and their respective relationship to each other for a plurality of complementary states of associated output saturated power. The table 72 may be established during and from ground testing, and any number of look-up tables may be utilized.

Referring to FIG. 4, one embodiment of the traveling wave tube amplifier system 19 of the present invention is illustrated. The system 19 includes a digital signal processor 80 receiving and modulating signals, a first digital-to-analog converter 82 and a second digital-to-analog converter 84 receiving digital signal processor signals, a high-voltage amplifier and impedance transformer 86 receiving signals from the first digital-to-analog converter 82, an up-converter 88 receiving signals from the second digital-to-analog converter 84, and an anode controlled traveling wave tube 90 receiving signals from the high-voltage amplifier and impedance transformer 86 and the up-converter 88.

The digital signal processor 80 includes two signal paths, one for processing the RF signals (RF signal path 89) and the other for separating out and processing the envelope of the RF signal (envelope signal path 91). Simultaneous to the anode modulation of the electron beam current in the envelope signal path 91, the RF applied to the RF input of the traveling wave tube amplifier system 19 is modulated through the RF signal path 89. Prior to application to the traveling wave tube amplifier system RF input, the RF signal is modified in such a manner that when it is applied to the RF input of the traveling wave tube 90 along with the envelope modulated electron beam, the traveling wave tube generates a distortion free "saturated" output power at each moment in time ("distortion free" generally refers to a signal free of Amplitude-to-Amplitude Conversion—"AM/AM", Amplitude-to-Phase Conversion "AM/PM", and so called "memory effects").

The traditional term for separating the envelope (envelope signal path 91) from the signal (RF signal path 89) and resizing an amplifier to improve power added efficiency is known as "Kahn Amplification". The traditional implementation of "Kahn Amplification" was applied to solid state power amplifiers by modulating the "DC Bias" line of the transistor collector. The modulation was achieved at a rate proportional to the signal bandwidth and at a power level proportional to the device power level. Generally the product of the bandwidth and the power level determines the difficulty or feasibility of constructing a modulator. In solid state power amplifiers having low power levels (0.25–10 Watts) and their small bandwidths for traditional cell phone or broadcast radio applications (5 Khz–200 Khz), the modulator is relatively simple and inexpensive to implement.

For satellite applications with traveling wave tube amplifiers, following the traditional approach proposed by Kahn, the collector voltage of the traveling wave tube would have to be modulated. With typical satellite bandwidths of 25–500 MHz and power levels on the order of 50–500 Watts, modulating the cathode is orders of magnitude more difficult than it is for SSPAs. This would be extremely difficult with prior technology, and hence prior to the present invention there were no commercial Kahn traveling wave tube amplifiers.

By considering the problem of modulating the electron beam rather than the cathode itself, several other possible implementations of Kahn are generated. The anode voltage, for example, is an excellent point to modulate the beam because although it is a high voltage, the anode draws nearly zero current and hence nearly zero power. Thus, the modulator itself is not required to provide any power, only a high voltage varying at a high frequency.

The digital signal processor 80 receives, for example, high power amplifier radiated power outputs and processes these signals, as discussed below. The digital signal processor 80 includes an oversample module 92, a digital limiter 94, a complex look-up table 96, a digital delay 98, an envelope module 100, and a look-up table with envelope-to-anode voltage conversion 102.

In one embodiment of the present invention, prior to up-conversion, the digital signal processor 80 or a digital signal processing circuit, which may include an Application Specific Integrated Circuit (ASIC) or Field Programmable Gate Array (FPGA), is used to adjust the envelope and RF modulation signals in order to compensate for the non-linearities of the modulator circuits, the traveling wave tube amplifier 90, and the relative delay of the envelope and the RF signals such that the signal coming out of the RF output port is a linearly amplified reproduction of the RF signal.

Input RF signals are received in the digital signal processor oversample module 92, which adds in-phase (I) and quadrature (Q) signals, i.e. I+Q of the signal. In one embodiment, the waveform is "over-sampled" by three-to-five times the bandwidth of the signal to allow for correct accounting of the non-linear quality of the typical values in the look-up tables 96, 102.

Signals from the oversample module 92 are received in the digital limiter 94 and limited thereby. In other words, the digital limiter 94 is a nonlinear electronic circuit having output limited in amplitude; used to limit the instantaneous amplitude of the oversample signal waveform (i.e. to clip off the peaks of the waveform). This limited signal is then linearized in the complex look-up table 96, which cycles AM/AM and AM/PM conversions.

The look-up table signal is received in the digital delay 98, which delays the RF signal of the RF signal path 89 for synchronization with the envelope signal of the envelope signal path 91. The delay signal is then converted to an analog signal in the first digital-to-analog converter 84. If, as in one embodiment, the RF Signal is in digital form, it is "up-converted" in the up-converter 88 to an appropriate frequency prior to being applied to the traveling wave tube RF Input 103 of the traveling wave tube 90.

The envelope module 100, on the envelope signal path 91, separates the RF envelope from the RF signal. The envelope of the RF signal is used to modulate at least one of the voltage or the current of the electron beam in the traveling wave tube. Signals from the envelope module 100 are received in the look-up table 102, which converts the envelope signal to an anode voltage signal. The look-up table signals are received in the second digital-to-analog converter 84 and converted to analog signals, which are amplified in the high voltage amplifier and impedance transformer 86 prior to reception in the anode control 104 of the traveling wave tube 90.

The RF signals amplified by the traveling wave tube amplifier system 19, with the use of non-constant envelope waveforms such as bandwidth limited quadrature phase-shift keying (QPSK), bandwidth efficient modulation (BEM) or quadrature amplitude modulation (QAM), orthogonal frequency-division-multiplexing (OFDM) and multi-carrier, include both phase and amplitude modulation. The present art operates the traveling wave tube amplifier system 19 in a "backed off" state so that the signal peaks are not distorted. With this method; however, when the RF signal has amplitude that is below the peak, the traveling wave tube amplifier system 19 may be operating in a power inefficient manner. The typical non-constant envelope waveform RF signal is on average at its peak amplitude for only a fraction of the time. The traveling wave tube amplifier system 19 is exceptionally efficient when it is operated at its "saturation point" where the input amplitude of the signal is equal to the input power level that achieves the maximum output power of the traveling wave tube.

The envelope of the RF signal (i.e. envelope signal in the envelope signal path 91) is used to modulate at least one of the voltage and current of the electron beam of the traveling wave tube 90.

In one embodiment of the present invention, the anode voltage of the traveling wave tube amplifier system 19 is used to modulate the current of the electron beam in such a manner that the output power of the traveling wave tube amplifier system 19 from the saturated electron beam is proportional to the waveform envelope (i.e. envelope-to-anode voltage). The traveling wave tube amplifier system 19 radio-frequency (RF) output power at this "effective saturation point" is as efficient (or nearly as efficient) at converting direct current (DC) power to RF power as the classical "saturation point" operation of the non-anode modulated traveling wave tube amplifier.

An alternate embodiment of the present invention includes any other method for modulating the electron beam of the traveling wave tube amplifier system 19 using the envelope of the RF signal. For example, three other implementations include: a) directly modulating the cathode for power added efficiency, b) splitting the helix from ground and modulating the helix and c) using the envelope to modulate a field emitter array (FEA) "cold cathode".

One primary point of novelty of the present invention is the variation of "Kahn modulation" that results in greater modulation bandwidth and resulting output power. Specifically, the present invention boosts the maximum power output of traveling wave tube amplifiers by modulating the electron beam rather than the cathode.

The present invention is a break-through in two respects. While the general prior art implementations of "Kahn Modulation" can greatly improve the power added efficiency compared with non-beam modulated amplification techniques (on the order of a factor of two), these implementations are generally not applicable for broadband (>>1 MHz) or high power (>50 W) systems. The invention implements a novel variation of Kahn that is both broadband and high power.

From a physics point of view, the effect of modulating the electron beam can be accomplished via other processes, such as modulating the electron beam directly, i.e. via the cathode. Typically the speed or bandwidth of any analog part and the power it consumes is limited by the amount of power that flows though it.

Figure 5:
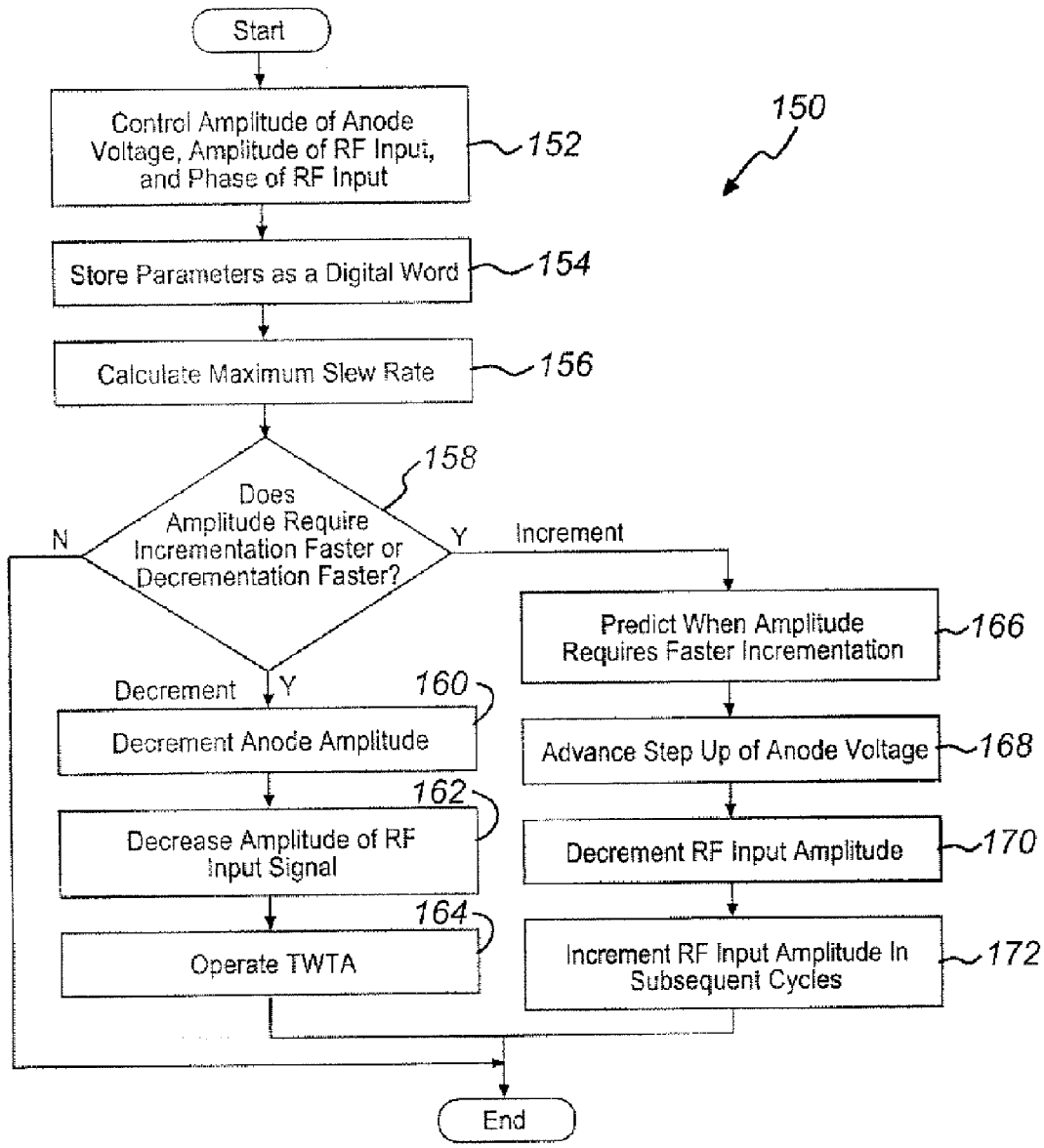
FIG. 5 is a logic flow diagram of a method for implementing envelope modulation in accordance with another embodiment of the present invention.

Referring now to FIGS. 4 and 5, a logic flow diagram 150 illustrates a method for implementing envelope modulation in accordance with another embodiment of the present invention. Logic starts in operation block 152 when the digital processor 80 or an anode controller 153 (anode modulator) within the digital processor controls the amplitude of the anode voltage, the amplitude of the RF input, and the phase of the RF input.

In operation block 154, the buffer 155 stores each of these three parameters as a digital word.

In operation block 156, the maximum slew rate of the anode voltage modulator circuit is generated and can be expressed in terms of a maximum amount (or counts) that the amplitude digital word can be incremented or decremented in a given step or clock cycle.

In inquiry block 158, a check is made whether the amplitude should be incremented faster or decremented faster.

In operation block 160, when the amplitude needs to be decremented faster (more than the maximum counts per cycle), the digital processor decrements the anode amplitude by the maximum count and, in operation block 162, decreases the amplitude of the RF input signal to the traveling wave tube RF input. When the RF signal to be amplified changes faster than the anode voltage modulator can tolerate, the traveling wave tube amplifier operates, in operation block 164, with a combination of anode voltage modulation and backing off of the RF input to the traveling wave tube amplifier until the anode voltage modulator can catch up.

Otherwise, in operation block 166, when the amplitude needs to be incremented faster than the anode voltage modulator can tolerate, the digital processor uses the buffer 155 to look ahead sufficient steps or clock cycles to predict when this will happen.

In response to this prediction, in operation block 168, the digital processor "advances" the step up of the anode voltage and, in operation block 170, decrements the RF input amplitude through the amplitude adjustment module 157.

In operation block 172, the RF input amplitude is incremented in the amplitude adjustment module 157 in subsequent cycles to augment the amount of amplitude modulation achieved by stepping up the anode voltage by the maximum amount (as limited by the hardware slew rate). The buffer size is determined by how far the digital processor needs to look ahead in order to accommodate the largest number of cycles that the anode modulator needs to catch up.

In operation, a power control method for a traveling wave tube amplifier system includes receiving an RF signal; generating a processed RF signal from the RF signal; generating an envelope of the RF signal from the RF signal; generating an electron beam; and modulating at least one of a voltage or a current of an electron beam generated in the traveling wave tube amplifier system with the envelope of the RF signal.

While the invention has been described in connection with one or more embodiments, it should be understood that the invention is not limited to those embodiments. On the contrary, the invention is intended to cover all alternatives, modifications, and equivalents, as may be included within the spirit and scope of the appended claims.

What is claimed is:

1. A method for compensating for slew rate limitations in a modulator for an amplifier having a frequency input comprising:
controlling an amplitude of an anode voltage of the amplifier, an amplitude of a frequency input to the amplifier, and a phase of said frequency input to the amplifier;
storing each of said amplitude of said anode voltage of the amplifier, said amplitude of said frequency input to the amplifier, and said phase of said frequency input to the amplifier as a digital word; and
generating a maximum slew rate of the modulator in terms of a maximum amount that said digital word can be incremented or decremented in a clock cycle.

2. The method of claim 1 further comprising decrementing an amplitude of said anode voltage by said maximum amount.

3. The method of claim 2 further comprising decreasing said amplitude of said frequency input signal to the amplifier frequency input.

4. The method of claim 1 further comprising operating the amplifier with a combination of anode voltage modulation and backing off of said frequency input to the amplifier, in response to said frequency signal to be amplified changing faster than the modulator can tolerate, until the modulator can catch up.

5. The method of claim 1 further comprising looking ahead sufficient clock steps to predict when said amplitude needs to be incremented faster than the modulator can tolerate.

6. The method of claim 5 further comprising advancing a step up of said anode voltage.

7. The method of claim 6 further comprising decrementing said frequency input amplitude.

8. The method of claim 7 further comprising incrementing said frequency input amplitude in subsequent cycles to augment an amount of amplitude modulation achieved by stepping up said anode voltage by said maximum amount.

9. The method of claim 8 further comprising generating a buffer size as a function of how far a processor needs to look ahead in order to accommodate a largest number of cycles that the modulator needs to catch up.

10. A method for compensating for slew rate limitations in an anode modulator for a traveling wave tube amplifier having an anode and a frequency input comprising:
controlling an anode voltage amplitude of the traveling wave tube amplifier anode, an amplitude of a frequency input to the traveling wave tube amplifier, and a phase of said frequency input to the traveling wave tube amplifier;
storing said anode voltage amplitude of the traveling wave tube amplifier anode, said amplitude of said frequency input to the traveling wave tube amplifier, and said phase of said frequency input to the traveling wave tube amplifier as a digital word; and generating a maximum slew rate of the anode modulator in terms of a maximum amount that said digital word can be incremented or decremented in a clock cycle; decrementing said anode amplitude by said maximum amount; and
decreasing said amplitude of said frequency input signal to the traveling wave tube amplifier frequency input.

11. The method of claim 10 further comprising operating the traveling wave tube amplifier with a combination of anode voltage modulation and backing off of said frequency input to the amplifier until the anode modulator can catch up in response to said frequency signal to be amplified changing faster than the anode modulator can tolerate.

12. The method of claim 10 further comprising looking ahead sufficient clock steps to predict when said amplitude should be incremented faster than the anode modulator can tolerate.

13. The method of claim 12 further comprising advancing a step up of said anode voltage.

14. The method of claim 13 further comprising decrementing said amplitude of said frequency input signal.

15. The method of claim 14 further comprising incrementing said amplitude of said frequency input signal in subsequent cycles to augment an amount of amplitude modulation achieved by stepping up said anode voltage by said maximum amount.

16. The method of claim 15 further comprising generating a buffer size as a function of how far a processor should look ahead in order to accommodate a largest number of cycles that the anode modulator needs to catch up.

17. A method for compensating for slew rate limitations in an anode modulator for a traveling wave tube amplifier having an anode and a frequency input comprising:
receiving an RF signal;
generating a processed RF signal from said RF signal;
generating an envelope of said RF signal from said RF signal;
receiving said envelope in the anode;
receiving said processed RF signal in the frequency input;
controlling an amplitude of a voltage of the traveling wave tube amplifier anode, an amplitude of a frequency input to the traveling wave tube amplifier, and a phase of said frequency input to the traveling wave tube amplifier;
storing said amplitude of said traveling wave tube amplifier anode voltage, said amplitude of said frequency input to the traveling wave tube amplifier, and said phase of said frequency input to the traveling wave tube amplifier as a digital word; generating a maximum slew rate of the anode modulator in terms of a maximum amount that said digital word can be incremented or decremented in a clock cycle; decrementing said amplitude of said traveling wave tube amplifier anode voltage by said maximum amount;
decreasing said amplitude of said frequency input signal to the traveling wave tube amplifier frequency input;
looking ahead sufficient steps to predict when said amplitude of said frequency input signal to the traveling wave tube amplifier frequency input needs to be incremented faster than the anode modulator can tolerate;
advancing a step up of said anode voltage;
decrementing said frequency input amplitude;
incrementing said frequency input amplitude in subsequent cycles to augment an amount of amplitude modulation achieved by stepping up said traveling wave tube amplifier anode voltage by said maximum amount; and
generating a buffer size as a function of how far a processor should look ahead in order to accommodate a largest number of cycles that the anode modulator needs to catch up;
generating an electron beam; and modulating at least one of a voltage or a current of said electron beam generated in the traveling wave tube amplifier with said envelope of said RF signal.

18. The method of claim 17 further comprising adding in-phase and quadrature signals of said RF signal.

19. The method of claim 17 further comprising limiting said RF signal.

20. The method of claim 17 further comprising generating delayed signal from said RF signal.

21. The method of claim 20 further comprising converting said RF signal to analog.

22. The method of claim 17 further comprising up-converting said RF signal to the traveling wave tube.

23. The method of claim 17 further comprising converting said envelope to said traveling wave tube anode voltage.

24. The system of claim 17, wherein modulating at least one of said voltage or said current of said electron beam further comprises modulating at least one of a voltage or a current of said electron beam generated in the traveling wave tube system.

25. A power control system for a satellite comprising:
a traveling wave tube amplifier comprising an anode and an RF input, said traveling wave tube amplifier receiving a processed RF signal in said RF input and an envelope of an RF signal in said anode, said envelope of said RF signal modulating a voltage of an electron beam generated in said traveling wave tube amplifier; and
a digital signal processor receiving said RF signal and generating said processed RF signal and said envelope of said RF signal from said RF signal, said digital processor comprising logic controlling an amplitude of a voltage of said anode, an amplitude of a frequency input signal to said traveling wave tube amplifier frequency input, and a phase of said frequency input to said traveling wave tube amplifier, said digital processor storing each of these three parameters as a digital word, and generating a maximum slew rate of said digital signal processor in terms of a maximum amount that said digital word can be incremented or decremented in a clock cycle.

26. The system of claim 25, wherein said digital processor further comprises logic decrementing said amplitude of said amplifier anode voltage by said maximum amount, and decreasing said amplitude of said frequency input signal to said traveling wave tube amplifier frequency input.

27. The system of claim 25, wherein said digital processor further comprises logic looking ahead sufficient steps to predict when said amplitude of said amplifier anode voltage needs to be incremented faster than said digital processor can tolerate.

28. The system of claim 27, wherein said digital processor further comprises logic advancing a step up of said traveling wave tube anode voltage, decrementing said frequency input amplitude, and incrementing said frequency input amplitude in subsequent cycles to augment an amount of amplitude modulation achieved by stepping up said anode voltage by said maximum amount.

29. The system of claim 28, wherein said digital processor further comprises logic generating a buffer size as a function of how far said digital processor needs to look ahead in order to accommodate a largest number of cycles that the digital processor needs to catch up.

30. The system of claim 25, wherein said electron beam voltage comprises a traveling wave tube helix voltage.

31. The system of claim 25, wherein said envelope modulates a traveling wave tube current.

32. The system of claim 25, wherein said digital processor further comprises an oversample module said oversample module adding in-phase and quadrature signals of said RF signals.

33. The system of claim 32, wherein said digital processor further comprises a digital limiter receiving and limiting said RF signals from said oversample module.

34. The system of claim 33, wherein said digital processor further comprises a complex look-up table receiving signals from said digital limiter and amplitude-to-amplitude conversion from said signals.

35. The system of claim 34, wherein said digital processor further comprises a digital delay receiving signals from said complex look-up table and generating delayed signals therefrom, wherein signals from said digital limiter are converted to analog signals and up-converted to said RF input of said traveling wave tube.

36. The system of claim 33, wherein said digital processor further comprises an envelope module receiving said RF signals from said oversample module and separating envelopes of said RF signals.

37. The system of claim 36, wherein said digital processor further comprises a look-up table comprising envelope-to-anode voltage conversions and converting said envelopes to linearized anode voltages, wherein signals from said look-up table comprising envelope-to-anode voltage conversions are converted to analog signals and received in an anode control of said traveling wave tube, wherein said envelopes modulate said electron beam.

38. A power control system for a satellite comprising:
a signal receiver receiving communication signals;
a high power amplifier receiving said communications signals, said high power amplifier comprising a traveling wave tube amplifier, said traveling wave tube amplifier comprising a traveling wave tube, generating electron beams, and a digital signal processor and anode modulator, said digital processor comprising an oversample module, a digital limiter, a complex look-up table, a digital delay, an envelope module, and a look-up table comprising envelope-to-anode voltage conversions, said oversample module adding in-phase and quadrature signals of said communications signals, said digital limiter receiving and limiting said communications signals from said oversample module, said complex look-up table receiving signals from said digital limiter and amplitude-toamplitude conversion from said signals, a digital delay receiving signals from said complex look-up table and generating delayed signals therefrom, wherein signals from said digital limiter are converted to analog signals and up-converted to an RF input of said traveling wave tube, said envelope module receiving said communications signals from said oversample module and separating envelopes of said communications signals, said look-up table comprising envelope-to-anode voltage conversions converting said envelopes to linearized anode voltages, wherein signals from said look-up table comprising envelope-to-anode voltage conversions are converted to analog signals and received in an anode control of said traveling wave tube, wherein said envelopes modulate said electron beams, said digital processor and anode modulator controlling an amplitude of a traveling wave tube amplifier anode voltage, an amplitude of a frequency input to said traveling wave tube amplifier, and a phase of said frequency input to said traveling wave tube amplifier, said digital processor and anode modulator storing said amplitude of said traveling wave tube amplifier anode voltage, said amplitude of said frequency input to said traveling wave tube amplifier, and said phase of said frequency input to said traveling wave tube amplifier as a digital word, said digital processor and anode modulator generating a maximum slew rate of said anode modulator in terms of a maximum amount that said digital word can be incremented or decremented in a clock cycle, said digital processor and anode modulator decrementing said amplitude of said traveling wave tube amplifier anode voltage by said maximum amount, said digital processor and anode modulator decreasing said amplitude of said frequency input signal to said traveling wave tube amplifier frequency input, said digital processor and anode modulator looking ahead sufficient steps to predict when said amplitude of said frequency input signal to said traveling wave tube amplifier frequency input needs to be incremented faster than said anode modulator can tolerate, said digital processor and anode modulator advancing a step up of said anode voltage, said digital processor and anode modulator decrementing said frequency input amplitude, Ssaid digital processor and anode modulator incrementing said frequency input amplitude in subsequent cycles to augment an amount of amplitude modulation achieved by stepping up said traveling wave tube amplifier anode voltage by said maximum amount, and said digital processor and anode modulator generating a buffer size as a function of how far a processor should look ahead in order to accommodate a largest number of cycles that said anode modulator needs to catch up; and an antenna transmitting said modulated electron beams.

39. The system of claim 38, wherein said envelope module comprises a non-constant envelope waveform, wherein said waveform comprises at least one of:

bandwidth limited quadrature phase-shift keying, bandwidth efficient modulation, quadrature amplitude modulation, orthogonal frequency-division-multiplexing, and multi-carrier.

* * * * *